US006356340B1

(12) United States Patent
Spence (10) Patent No.: US 6,356,340 B1
(45) Date of Patent: Mar. 12, 2002

(54) PIEZO PROGRAMMABLE RETICLE FOR EUV LITHOGRAPHY

(75) Inventor: Christopher A. Spence, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/197,020

(22) Filed: Nov. 20, 1998

(51) Int. Cl.⁷ .......................... G03B 27/42; G03F 9/00
(52) U.S. Cl. ............................... 355/53; 430/5
(58) Field of Search ....................... 355/53, 67–71; 430/5, 20, 22, 30, 311; 250/492.2, 492.22

(56) References Cited

U.S. PATENT DOCUMENTS

| | | | |
|---|---|---|---|
| 3,951,546 A | 4/1976 | Markle | 355/133 |
| 4,293,184 A | 10/1981 | Minoura et al. | 350/6.3 |
| 5,503,950 A | 4/1996 | Miyake et al. | 430/5 |
| 5,617,182 A | 4/1997 | Wakamoto et al. | 355/53 |
| 5,691,541 A | 11/1997 | Ceglio et al. | 250/492.1 |
| 5,706,077 A | 1/1998 | Unno | 355/71 |
| 5,742,362 A * | 4/1998 | Chikamichi | 349/2 |
| 5,870,176 A * | 2/1999 | Sweatt et al. | 355/53 |
| 5,989,752 A * | 11/1999 | Chiu | 430/5 |
| 6,060,224 A * | 5/2000 | Sweatt et al. | 430/395 |
| 6,084,656 A * | 7/2000 | Choi et al. | 355/71 |

OTHER PUBLICATIONS

Bloom, D.M., The Grating Light Valve: Revolutionizing Display Technology, presented at the IS&T/SPIE Symposium on Electronic Science and Technology, Photonics West/Electronic Imaging Conference, Feb. 12, 1997.*

* cited by examiner

Primary Examiner—Russell Adams
Assistant Examiner—Hung Henry Nguyen
(74) Attorney, Agent, or Firm—Renner, Otto, Boisselle & Skar, LLP (57) ABSTRACT

A programmable reticle has a plurality of addressable pixels. Each of the pixels has one or more elastic elements which underlie a reflective surface, the elements each being activatable for selectively deforming part of the reflective surface. The amount of deformation is such that light reflected from a deformed part destructively interferes with light reflected from the vicinity of the deformed part. The programmable reticle may be used as a part of a scanning lithography system wherein a wafer or other device to be exposed is moved to expose different of its areas, while the pattern on the programmable reticle is changed to reflect the desired exposure pattern of the area of the wafer currently being exposed. In such a scanning system, any given point on the wafer will be exposed using a number of different pixels on the reticle; therefore the effect of a defective pixel will be "diluted" or "voted out" by the other, non-defective pixels also involved in exposing that spot.

25 Claims, 7 Drawing Sheets

PIEZO PROGRAMMABLE RETICLE FOR EUV LITHOGRAPHY

TECHNICAL FIELD

The present invention generally relates to lithography, and in particular to reflective reticles for use in extreme ultraviolet (EUV) lithography for printing a pattern onto a device such as a wafer or a circuit board.

BACKGROUND OF THE INVENTION

In the semiconductor industry, there is a continuing trend toward higher device densities. To achieve these high densities there has been and continues to be efforts toward scaling down the device dimensions on semiconductor wafers. In order to accomplish such high device packing density, smaller features sizes are required. This may include the width and spacing of interconnecting lines.

The requirement of small features with close spacing between adjacent features requires high resolution lithographic processes. In general, projection lithography refers to processes for pattern transfer between various media. It is a technique used for integrated circuit fabrication in which a silicon slice, the wafer, is coated uniformly with a radiation-sensitive film, the resist, and an exposing source (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating causes the image area to become selectively crosslinked (for a negative projection) or deprotected (for a positive projection) and consequently either more or less soluble (depending on the coating) in a particular solvent developer. The more soluble (i.e., uncrosslinked or deprotected) areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image them with radiation of a shorter wavelength. "Long" or "soft" x-rays (a.k.a, extreme ultraviolet (EUV)), wavelength range of lambda=50 to 700 Angstroms (Å) (5 to 70 nm) are now at the forefront of research in an effort to achieve the desired smaller feature sizes.

EUV lithography may be carried out as follows. EUV radiation is projected onto a resonant-reflective reticle. The resonant-reflective reticle reflects a substantial portion of the EUV radiation which carries a pattern for an IC layer formed on the reticle to an all resonant-reflective imaging system (e.g., series of high precision mirrors). A demagnified (optically reduced) image of the reticle pattern is projected onto a resist-coated wafer. The entire reticle pattern is exposed onto the wafer by synchronously scanning the reticle and the wafer (i.e., a step-and-scan exposure).

Although EUV lithography provides substantial advantages with respect to achieving high resolution patterning, errors may still result from the EUV lithography process. For example, defects on the reticle may cause defects in corresponding locations on the wafer. These defects on the reticle may be difficult and costly to correct. The corresponding defects on the wafer may also be difficult or even impossible to correct, with the difficulty of correcting mistakes generally increasing as device density on the wafer is increased. Uncorrectable mistakes in the reticle or wafer result in decreased performance, increased costs, and/or scrapping of products.

Additionally, EUV masks or reticles are increasingly expensive to fabricate, with costs projected to be in excess of $100,000 each. Since reticles generally involve a permanent image etched or otherwise formed into reflective material, a new IC design or change to an existing IC design involves production of a new mask or reticle design.

Consequently, it will be appreciated that it would be desirable to have a reticle that could be used to form various patterns, and that would minimize the impact of defects.

SUMMARY OF THE INVENTION

The present invention involves a programmable reticle having a plurality of addressable pixels. Each of the pixels has one or more elastic elements which underlie a reflective surface, the elements each being activatable for selectively deforming part of the reflective surface. The amount of deformation is such that light reflected from a deformed part destructively interferes with light reflected from the vicinity of the deformed part.

The programmable reticle may be used as a part of a scanning lithography system wherein a wafer or other device to be exposed is moved to expose different of its areas, while the pattern on the programmable reticle is changed to reflect the desired exposure pattern of the area of the wafer currently being exposed. In such a scanning system, any given point on the wafer will be exposed using a number of different pixels on the reticle; therefore the effect of a defective pixel will be "diluted" or "voted out" by the other, non-defective pixels also involved in exposing that spot.

According to one aspect of the invention, a programmable reflective lithography reticle includes a substrate; a plurality of addressable pixels on the substrate, each of the pixels having at least one activatable elastic element; and a reflective material for reflecting light incident on the reticle. The elements selectively locally displace portions of the reflective material, thereby causing destructive or constructive interference of light reflected by the reflective material in the vicinity of the elements.

According to another aspect of the invention, a lithography system includes a light source; a reflective reticle reducing optics for focusing light emitted from the reticle on a wafer; and a scanning mechanism for moving the wafer to expose different areas of the wafer to light emitted from the reticle. The reticle includes a substrate; a plurality of addressable pixels on the substrate, each of the pixels having at least one activatable elastic element; and a reflective material for reflecting light incident on the reticle. The elements selectively locally displace the reflective material, thereby causing destructive or constructive interference of light reflected by the reflective material in the vicinity of respective of the elements; and According to a further aspect of the invention, a method of making a programmable lithography reflective reticle includes the steps of: forming bottom electrodes on a substrate; depositing a layer of piezoelectric material on top of the bottom electrodes and the substrate; depositing a top electrode layer on the piezoelectric material; and depositing a reflecting material on the reticle.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout.

Figure 1:
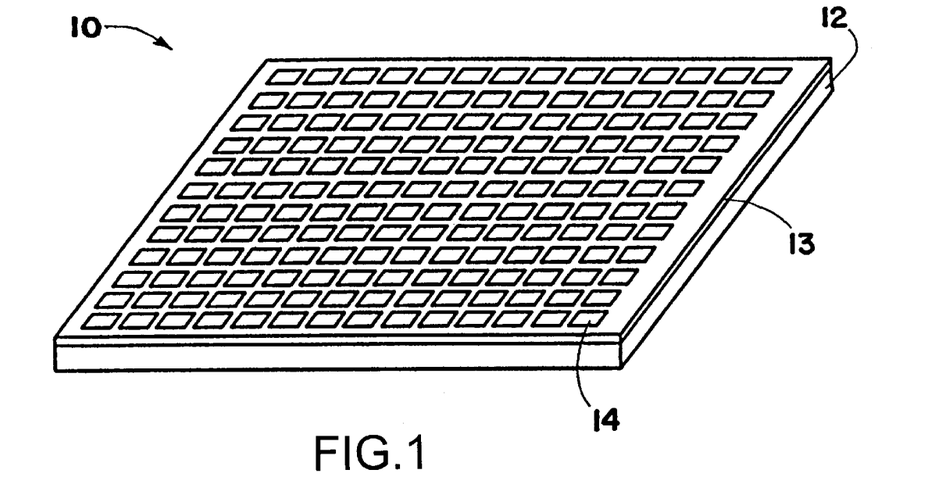
FIG. 1 is a perspective illustration of a programmable reflective reticle in accordance with the present invention.

Referring initially to FIG. 1, a programmable reflective lithography reticle 10 is shown. The reticle 10 has a substrate 12 made, for example, of silicon. The substrate 12 has a reflective surface 13 thereupon.

The reflective surface 13 is made of a reflective material capable of reflecting incident light. The reflective material used is dependent on the wavelength of light to be reflected. For an exemplary embodiment which involves reflecting ultraviolet light having a wavelength of about 13 nm, the reflecting material may be a multilayer stack of molybdenum-silicon and/or molybdenum-beryllium films. However, it will be appreciated that other reflecting surfaces or films may be used.

The reflective surface 13 is divided up into a plurality of reflective pixels 14. The pixels 14 are shown for illustrative purposes only in FIG. 1 as squares upon the reflective surface 13. The pixels 14 may in actuality not be visible on the reflective surface 13 as discrete entities.

Figure 2:
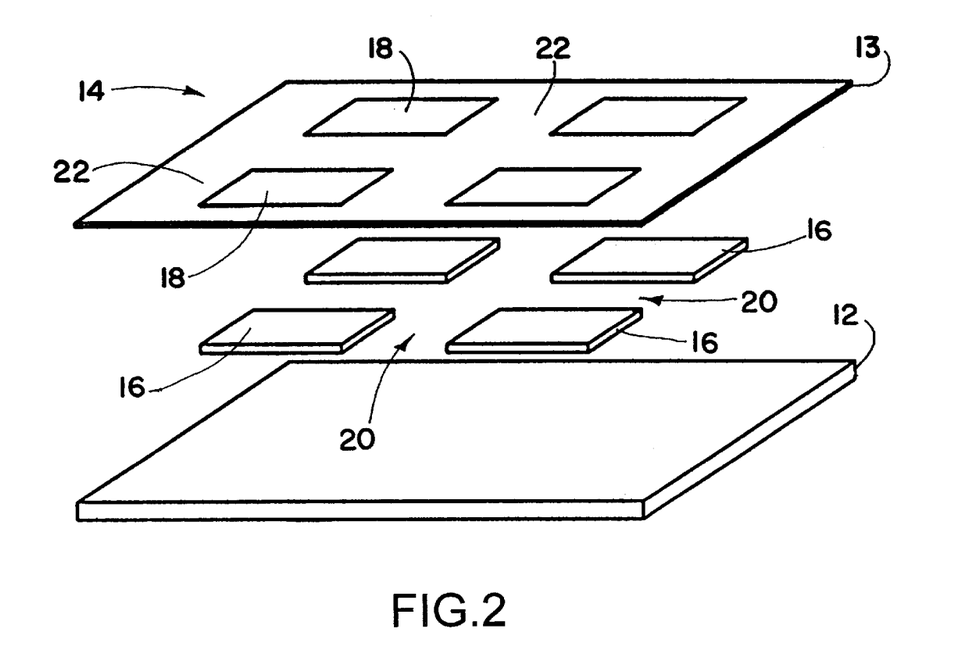
FIG. 2 is an exploded view of the details of a pixel of the reticle of FIG. 1.

FIG. 2 shows an exploded view of an exemplary of the pixels 14. Each of the pixels has one or more elastic elements 16 between the reflective surface 13 and the substrate 12. Each of the elements 16 has an associated movable part of the reflective surface 13, a displacable reflective area 18. The elements 16 are elastic in that they can each selectively raise or lower its associated displacable reflective area 18.

Element-free areas 20 are between adjacent of the elements 16 in the space between the reflective surface 13 and the substrate 12. These element-free areas 20 are typically filled with an inert material which is not selectively expandable or contractable. Associated with the element-free areas 20 are non-displaced reflective areas 22 of the reflective surface 13.

The elements 16 of the pixel 14 can be configured such that the displacable reflective areas 18 are at the same height relative to the substrate 12 as the non-displaced reflective areas 22. For such a configuration light reflected from the various areas of the reflective surface 13 associated with the pixel 14 constructively interferes. The pixel 14 therefore reflects light. In this configuration, the pixel is referred to as being "non-activated," or "light."

However, if the elements 16 are configured such that the displacable reflective areas 18 deflected by approximately one quarter of the wavelength of incident light (e.g., about 3 nm for 13 nm EUV incident light) relative to the non-displacable reflective areas 22, then light reflected from the pixel 14 will experience destructive interference. Thus, it will appear that no light is reflected from the pixel 14. Such a configuration is referred to as "activated," (since the elements have moved parts of the reflective surface) or "dark." The displaceable reflective areas 18 will preferably be approximately the same as the non-displaced areas 22, in order to maximize the potential for destructive interference.

It will be appreciated that many means could be used to effect displacement of the reflected surface 13 of the reticle 10 in the vicinity of each of the elements 16. One such method, using a piezoelectric material between two electrodes, is described in greater detail below.

Thus, individual of the pixels 14 of the reticle 10 may be made light or dark as needed. A single programmable reticle may be used for different desired exposure patterns for a wafer. In addition, it will be appreciated that only a small amount of the exposure pattern for the wafer need be on the reticle at any one time. Therefore, the size of the programmable reticle may be much less than that of a reticle that would be required to contain all or a significant portion of the exposure pattern for the wafer. The programmable reticle may have a large number of pixels, for example being 10,000 by 10,000 pixels. In an exemplary embodiment, a pixel has a width of 100 nm. It will be appreciated that the reticle need not be square; the reticle may have more pixels in one direction than another.

Figure 3:
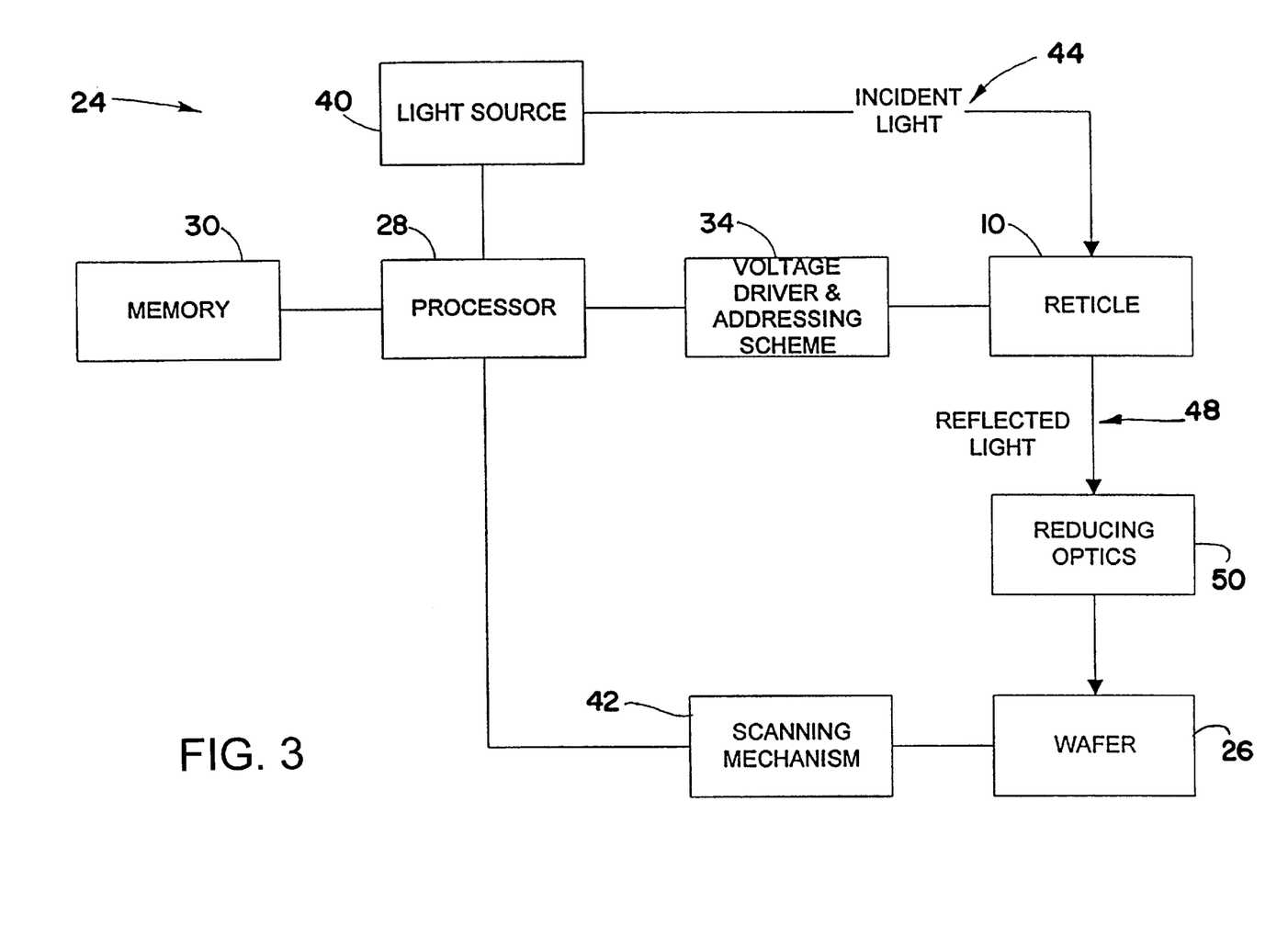
FIG. 3 is a schematic block diagram illustrating a scanning lithography system in accordance with the present invention.
Figure 4:
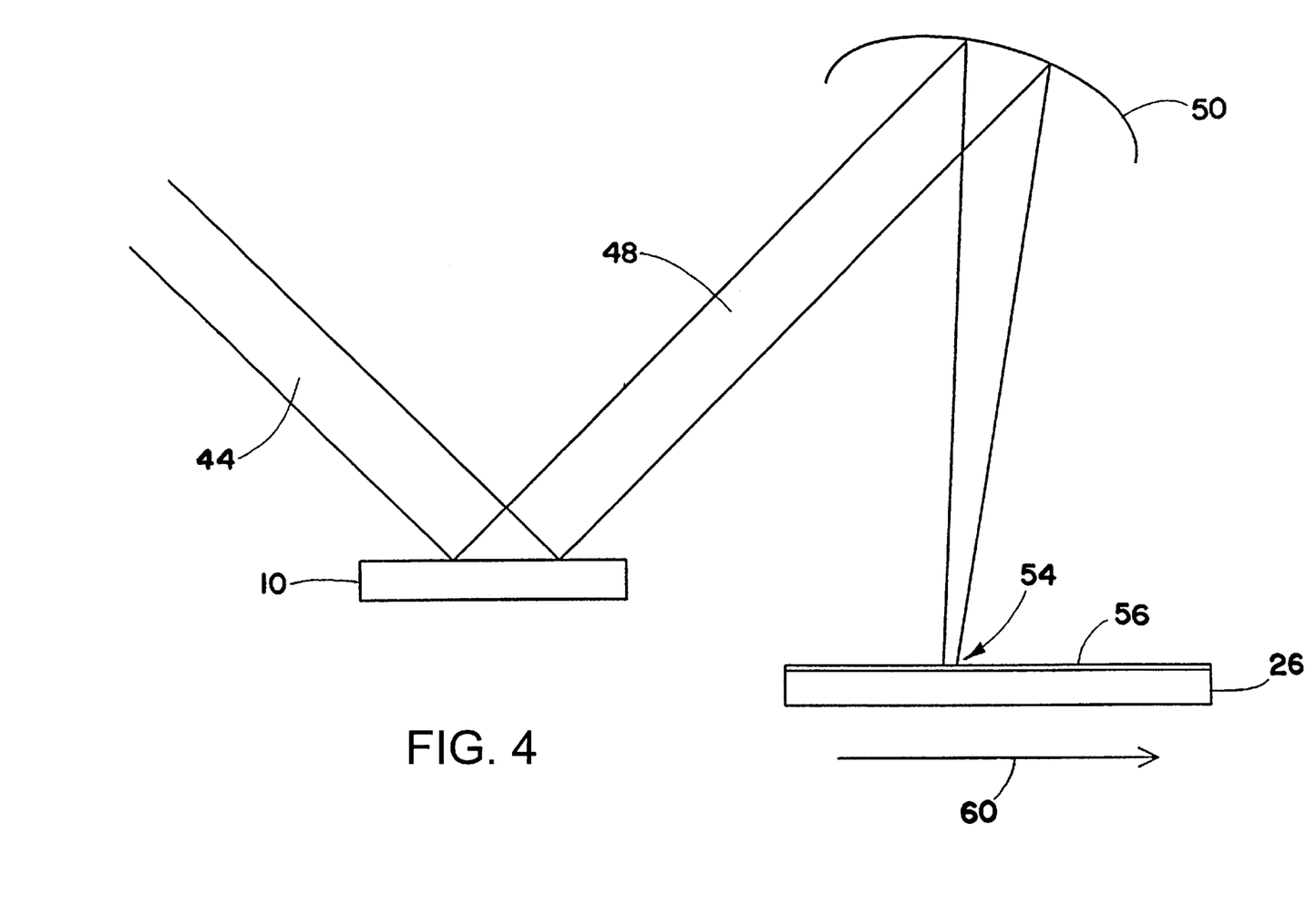
FIG. 4 is a schematic side view illustrating a portion of the system of FIG. 3.

Referring to FIGS. 3 and 4, the reticle 10 is shown as part of a system 24 for exposing a wafer 26. The operation of the system 24 is controlled by a processor or CPU 28, which may be any of a plurality of processors such as the AMD K6 processor, a digital signal processing chip, or other similar, compatible, or comparable processors.

The processor 28 reads information from a memory 30. The memory 30 contains information regarding the desired exposure of the wafer 26. The processor 28 sends appropriate of the information from the memory 30 to a voltage driver and addressing scheme 34 for configuring the reticle 10. Appropriate of the pixels of the reticle 10 are made light or dark for properly exposing a portion of the wafer 26.

The processor 28 also may control a light source 40 and a scanning mechanism 42. The light source 40 typically involves a high-power laser and a laser-produced plasma for producing ultraviolet light having wavelengths around 13 nm. The incident light 44 from the light source 40 may travel through a system of condenser optics (not shown) before reaching the reticle 10.

Reflected light 48 emanating from the light areas of the reticle 10 may be passed through reducing optics 50 before reaching the wafer 26. Exemplary reducing optics would be a 30× mirror. This use of reducing optics allows the pixel size of the reticle to be greater than the resolution desired on the wafer 26. Larger-sized pixels allow for easier fabrication of the programmable reticle 10, thus reducing manufacturing costs.

Following the reduction by the reducing optics 50, the reflected light 48 exposes an area 54 of the resist 56 on the surface of the wafer 26.

The scanning mechanism 42 moves the wafer during the exposure process, for example in the direction 60 as shown in FIG. 4. Successive areas of the wafer 26 are scanned during the exposure process. The pattern on the programmable reticle 10 is altered to reflect the desired exposure of the area of the wafer being exposed at that given time.

The light source 40 may be a pulsed light source. In such a case, the pulsing of the light source may be synchronized with movement of the wafer caused by the scanning mechanism. Thus, the wafer may be moved only when there is no light incident on the wafer, thus avoiding blurring caused by having light incident on the wafer while it is being moved and while the configuration of the programmable reticle is being changed. Alternatively, some blurring may be acceptable, if the movement of the wafer and the pulse duration of the light were such that the amount of blurring was less the desired feature resolution. For short duration pulses the scanning may be continuous.

Figure 5A:
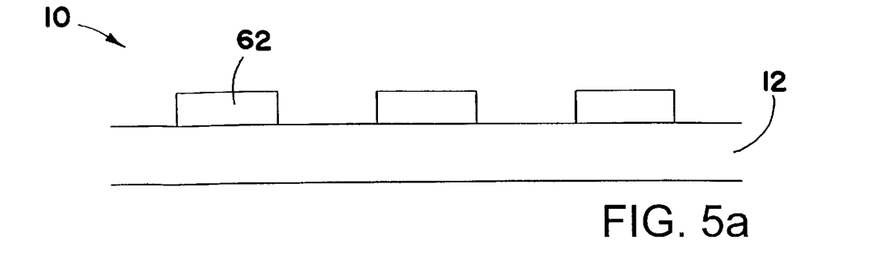
FIGS. 5a–5d illustrate the steps in the manufacture of a programmable reticle in accordance with the present invention.

Referring to FIGS. 5a–5d, steps in fabrication of the programmable reticle 10 are shown. Initially, as shown in FIG. 5a, an array of bottom electrodes 62 are formed on the substrate 12. The bottom electrodes are formed of a conductive material, for example aluminum, titanium, gold or silver. The electrodes are formed by deposition the conductive material on the substrate, and then by removing the material between electrodes by etching.

The process of depositing the conductive material is accomplished using well known techniques. Exemplary techniques are chemical vapor deposition, sputtering, and physical vapor deposition through evaporation.

Etching is accomplished using well known techniques of dry or wet etching. Dry etching has the advantage of being anisotropic, that is that it is more direction specific when compared with wet etching. Exemplary materials for etching aluminum are carbon tetrachloride vapor and chlorine gas.

It will be appreciated that the terms "bottom" and "top," as used herein, refer only to the illustrated embodiment. The substrate may have any orientation with the electrodes and other items described below placed thereupon.

Figure 5B:
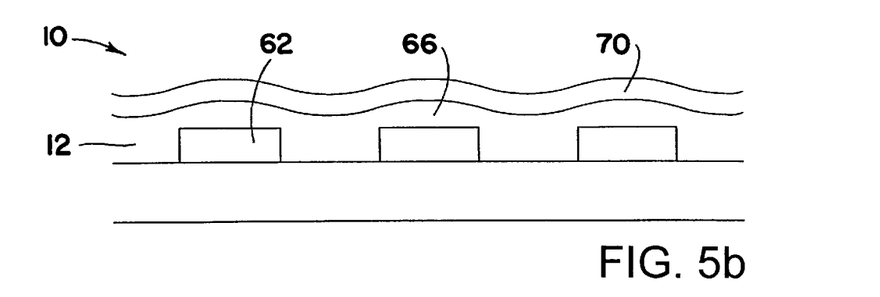

Referring to FIG. 5b, a layer of piezoelectric material 66 is then placed atop the substrate 12 and the bottom electrodes 62. Exemplary piezoelectric materials include quartz, rochelle salt, tourmaline, ammonium dihydrogen phosphate, and ephylenediamine tartrate. Exemplary techniques for depositing the piezoelectric material include chemical vapor deposition, sputtering, and physical vapor deposition through evaporation. The thickness of the piezoelectric material 66 on top of the bottom electrode 62 should be such that the piezoelectric material 66 deflects by a quarter wavelength of the light (approximately 3 nm for 13 nm ultraviolet light) from the light source 40 when a voltage is applied via the electrodes. It will be appreciated that for a given desired deflection the amount of voltage applied and the thickness of the piezoelectric material are interrelated. The precise voltages and thicknesses for a given wavelength may be determined empirically or otherwise.

Following the deposit of the piezoelectric material 66, a top electrode conducting material 70 is deposited. Techniques for depositing the conducting material 70 may be similar to those described above for the conducting material of the bottom electrodes.

Figure 5C:
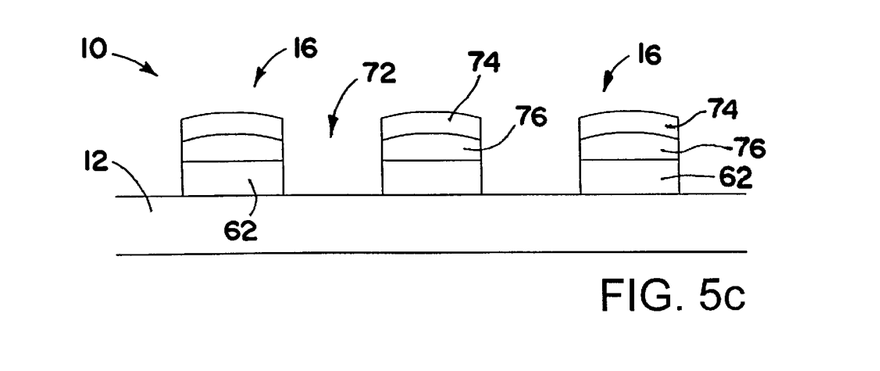

Referring to FIG. 5c, the piezoelectric material 66 and the top electrode material 70 are removed from the spaces 72 between adjacent of the bottom electrodes 62 in all directions along the substrate 12. Removal may be by the etching processes described above. Top electrodes 74 and piezoelectric material layers 76 of each of the elastic elements 16 are thereby formed.

Concurrently with or after removal of the electrode material 66, an addressing scheme is applied to the reticle 10 to allow a voltage to be applied to some of the elements 16 independent of other of the elements 16. Suitable addressing schemes will be appreciated by one skilled in the art. Such addressing schemes are, for example, used in addressing of electrodes for active matrix liquid crystal displays. Provision of, for example, data lines, scanning lines, etc., will be conventional and known by one skilled in the art. Details of suitable addressing schemes are not explained herein for the sake of brevity.

The addressing scheme may be such that all of the elements of a single pixel are interconnected. Thus, a single signal may be used to activate all of the elements of a single pixel. The individual pixels, on the other hand, may be individually addressed as is commonly done in active matrix displays or scanning displays.

Figure 5D:
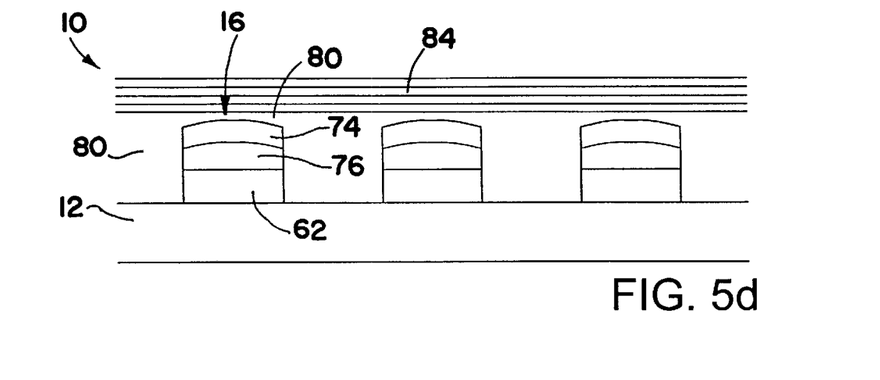

Concurrently with or after the addressing scheme is formed, insulating material 80 is deposited on top of and between the elements 16, as shown in FIG. 5d. The insulating material may be an oxide, such as silicon dioxide. The oxide may be deposited using a spin on glass method, or a via chemical vapor deposition. The insulating material 80 may be polished to provide a flat surface for placement of a reflecting material 84. Silicone nitride or titanium nitride may be applied as a polish stop.

As stated above, the reflecting material 84 may be a multilayer stack of molybdenum-silicon and/or molybdenum-beryllium films. For example, 50 pairs of films may be used, with a total thickness of 100 nm. However, it will be appreciated that other reflecting surfaces or films may be used.

In addition, although the reflecting material 84 is shown as a single stack of layers, other configurations are possible. For example, there may be a separate reflecting material or stack of layers corresponding to each pixel or to groups of pixels. Furthermore, it may be possible to put a separate reflecting layer on each of the elements and on each of the element-free areas.

It will be understood that variations of the method described above are possible. For example, etching to remove material to form the bottom electrodes may be deferred until the piezoelectric material and top electrode material have been deposited.

Figure 6:
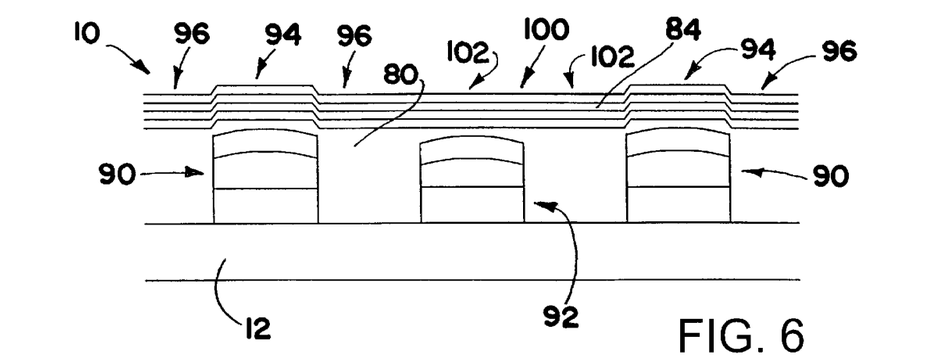
FIG. 6 is a side view showing operation of a programmable reticle in accordance with the present invention.

Referring to FIG. 6, operation of the programmable reticle 10 is shown. In FIG. 6, two activated elements 90, and one non-activated element 92, are shown. It will be appreciated that some elasticity is required in the insulating material 80 and the reflecting material 84 in order for the reflecting material 84 to be able to deform in response to pressure exerted by the expansion of the piezoelectric material 66. The insulating material 80 and the reflecting material 84 will exert a force on the elements 18 opposing the deformations. This opposing force will have to be taken into account when choosing the thickness of the piezoelectric material and the voltage to activate that material.

The deformation of the reflecting material 84 by activation of the activated pixels 90 will create a destructive interference between light reflected from the displaced areas 94 of the reflecting material 84 and adjacent areas 96. For the non-activated pixel 92, the area 100 of the reflector 84 immediately above the pixel 92 is at the same level as the adjacent areas 102. Therefore, there is no destructive interference between light reflected from the area 100 and the areas 102.

FIGS. 7a–7b and 8a–8i demonstrate a "voting" effect whereby the effect of defective (bad) pixels is reduced. If a scanning exposure method is used, then the same area on the wafer is exposed by multiple pixels on the programmable reticle. Since most of the pixels on the reticle 10 corresponding to the exposed area on the wafer would not be defective, the effect of defective pixels is diluted. This voting effect also averages out surface roughness effects that effect the light reflected from the reticle.

Figure 7A:
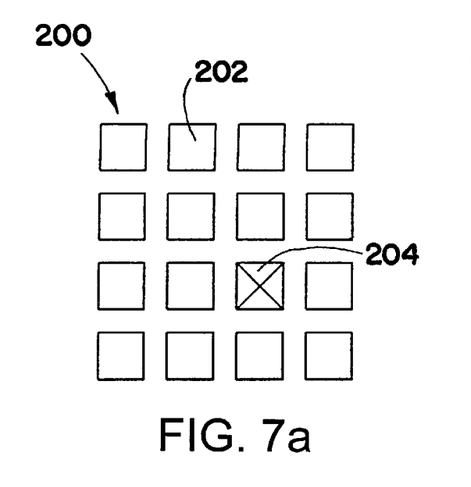
FIGS. 7a and 7b illustrate, respectfully, a portion of reticle in accordance with the present invention, and a portion of a wafer to be exposed.

Referring to FIG. 7a, a portion 200 is shown of a programmable reticle in accordance with the invention. The portion 200 has many pixels 202 arranged in rows and columns. The portion 200 also has a defective pixel 204. In this example, the defective pixel is always dark, that is, it does not reflect light onto the wafer. Such a defective pixel may come about due to defects in the arrangement of the piezoelectric material in the electrodes, or alternatively may come about due to a surface roughness defect in the reflecting material. It will be appreciated that defective pixels may also occur that are always light, due, for example, to an inability to activate the piezoelectric material for such a pixel.

Figure 7B:
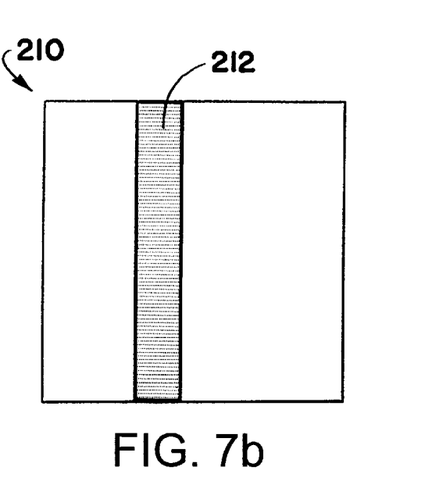

FIG. 7b shows a portion 210 of a wafer. The wafer portion 210 includes an area 212 which is to be exposed to light reflected from the reticle 10, the area 212 being on the boundary between exposed and unexposed areas of the portion 210.

Figure 8A:
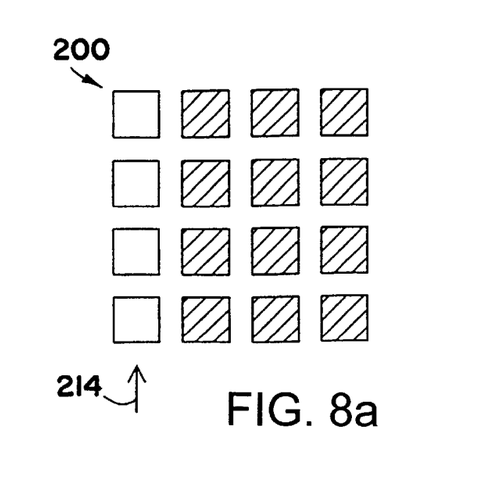
FIGS. 8a–8i illustrate the "voting out" of a defective pixel by use of a reticle of the present invention in a scanning lithography system.
Figure 8B:
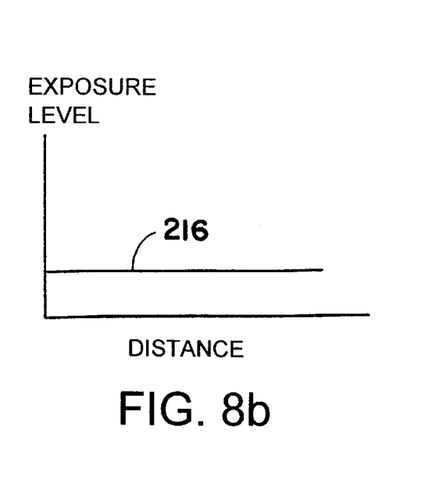

FIGS. 8a and 8b show the operation at a time t1, with non-activated (light) pixels indicated as open squares and activated (dark) pixels indicated as shaded squares. At time t1, the wafer portion 210 is in a position such that the leftmost column of the pixels 202 (indicated by an arrow 214 in FIG. 8a) controls whether the area 212 is illuminated. The pixels 202 in this leftmost column are non-activated, and therefore reflect light onto the area 212. Accordingly, the area 212 is uniformly exposed to light along its height. This exposure is indicated in FIG. 8b, which is a graph of light exposure level 216 versus height along the area 212.

Figure 8C:
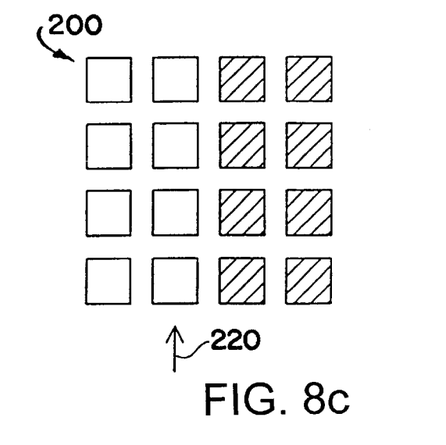
Figure 8D:
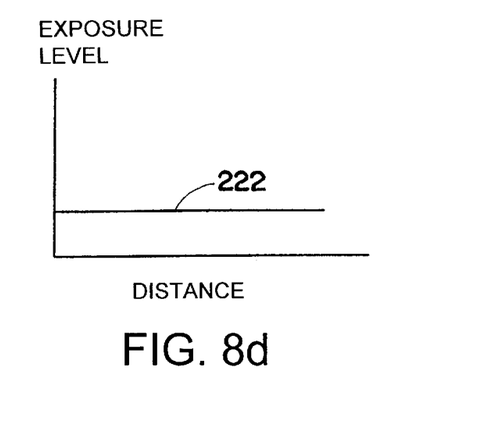

FIGS. 8c and 8d demonstrate the exposure at a later time, a time t2. At time t2, the scanning mechanism has moved the wafer portion 210 sufficiently far such that a second column of pixels (indicated by an arrow 220) illuminates the area 212. As seen in FIG. 8d, the exposure level 222 along the area 212 is again uniform.

Figure 8E:
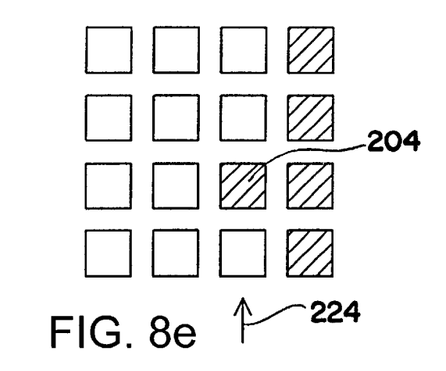
Figure 8F:
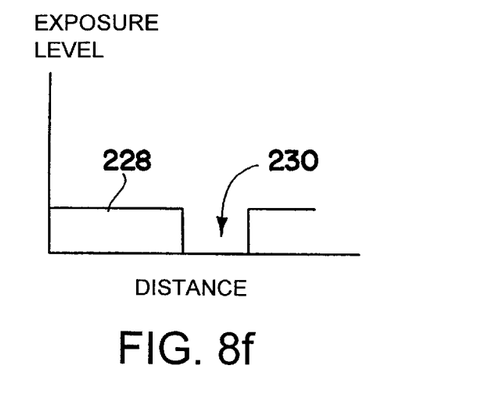

At time t3, shown in FIGS. 8e and 8f, the exposure of the area 212 is non-uniform due to the presence of the defective pixel 204 in the column of pixels 224. Thus referring to FIG. 8f, an exposure level 228 along the area 212 for time t3 shows an unexposed portion 230 for part of the area 212.

Figure 8G:
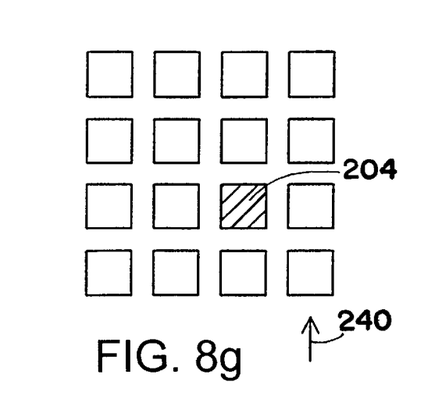
Figure 8H:
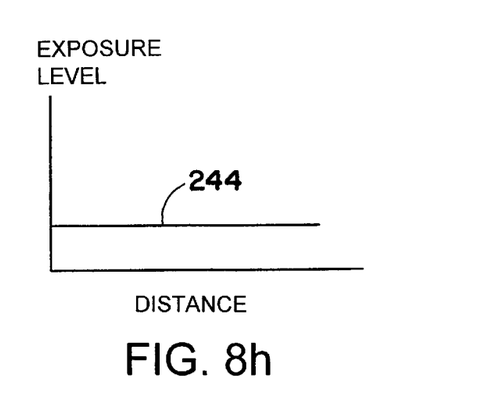

Referring to FIGS. 8g and 8h, at time t4 the wafer portion 210 is once again in a position where a column of non-defective pixels, indicated by an arrow 240 in FIG. 8g, reflect light onto the area 212. Thus, as shown in FIG. 8h, the exposure level 244 along the area 212 is uniform. The defective pixel 204 is still incorrectly dark, but no longer impacts exposure of the area 212 due to movement of the wafer between times t3 and t4.

Figure 8I:
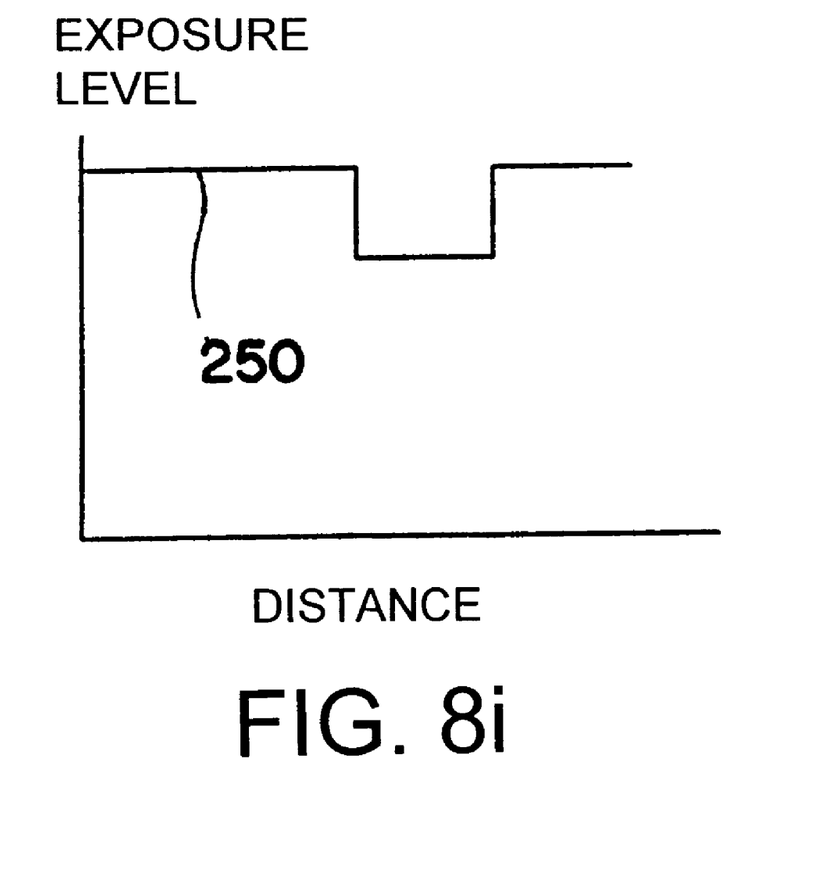

FIG. 8i shows an exposure level 250, the sum of the exposure levels at the times t1–t4. In this simplified example it can be seen that the effect of the defective pixel was diluted by the three properly-operating pixels that illuminated the corresponding area on the wafer. The corresponding area thus received 75% of the illumination it should have received, a level which may be operatively equivalent to fully exposing the photo resist in that area. It will be appreciated that even more dilution or "voting out" of defective pixels may be obtained by using a larger number of pixels to expose each area. It will therefore be appreciated that having a large number of pixels is desirable in terms of this "voting out."

It will be appreciated that re-addressing the pixels to compensate for movement of the wafer involves the addition of very little new information. For the most part, information regarding one row of pixels is shifted to the next row or column of pixels, as appropriate. This electronic shifting simplifies the re-addressing process.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A programmable reflective lithography reticle, comprising:
    a substrate;
    a plurality of addressable pixels on the substrate, each of the pixels having at least one activatable elastic element; and
    a reflective material for reflecting light incident on the reticle;
    wherein the elements selectively locally displace portions of the reflective material; and
    wherein each of the elements includes a piezoelectric material between a pair of electrodes.

2. The reticle of claim 1, further comprising an insulating material between the elements and the reflective material.

3. The reticle of claim 1, wherein the piezoelectric material includes a material selected from the group of quartz, rochelle salt, tourmaline, ammonium dihydrogen phosphate, and ephylenediamine tartrate.

4. The reticle of claim 1, wherein the electrodes include a material selected from the group of aluminum, titanium, gold, and silver.

5. The reticle of claim 1, wherein the reflective material is a stack of layers.

6. The reticle of claim 5, wherein the reflective material includes a reflective material selected from the group of molybdenum-silicon films and molybdenum-beryllium films.

7. The reticle of claim 5, wherein the reflective material is a deformable material which covers a plurality of pixels.

8. A lithography system comprising:
   a light source; and
   a reflective reticle which includes:
      a substrate;
      a plurality of addressable pixels on the substrate, each of the pixels having at
      least one activatable elastic element; and
      a reflective material for reflecting light incident on the reticle; and reducing optics for focusing light emitted from the reticle on a wafer;
      a scanning mechanism for moving the wafer to expose different areas of the wafer to light emitted from the reticle;
      wherein the elements selectively locally displace the reflective material, and wherein the reflective material is a deformable material which covers a plurality of pixels; and
      wherein the reticle further includes an insulating material between the elements and the reflective material, wherein each of the elements includes a piezoelectric material between a pair of electrodes, and wherein the elements are spaced apart, having an element-free area between adjacent of the elements.

9. The system of claim 8, wherein the light source is a pulsed light source.

10. The system of claim 8, further comprising a processor which integrates programming of the elements with movement of the wafer by the scanning mechanism.

11. The system of claim 8, wherein the light source is a nonpulsed light source.

12. A programmable reflective lithography reticle, comprising:
   a substrate;
   a plurality of addressable pixels on the substrate, each of the pixels having at least one activatable elastic element; and
   a reflective material for reflecting light incident on the reticle;
   wherein the elements selectively locally displace portions of the reflective material, and wherein the reflective material is a deformable material which covers a plurality of pixels; and
   wherein each of the elements includes a piezoelectric material between a pair of electrodes.

13. The reticle of claim 12, wherein the piezoelectric material includes a material selected from the group of quartz, rochelle salt, tourmaline, ammonium dihydrogen phosphate, and ephylenediamine tartrate.

14. The reticle of claim 12, wherein the electrodes include a material selected from the group of aluminum, titanium, gold, and silver.

15. A programmable reflective lithography reticle, comprising:
   a substrate;
   a plurality of addressable pixels on the substrate, each of the pixels having at least one activatable elastic element;
   an insulating material between the elements and the reflective material; and
   a reflective material for reflecting light incident on the reticle;
   wherein the elements selectively locally displace portions of the reflective material, and wherein the reflective material is a deformable material which covers a plurality of pixels.

16. The reticle of claim 15, wherein the elements selectively locally displace the portions in a direction normal to a surface of the substrate.

17. The reticle of claim 16, wherein the elements selectively locally displace the portions a distance approximately one quarter of the wavelength of the incident light.

18. The reticle of claim 16, wherein the elements selectively locally displace the portions a distance between 3 nm and 4 nm.

19. The reticle of claim 15, wherein each of the pixels includes only one element.

20. The reticle of claim 15, wherein the reflective material is a stack of layers.

21. The reticle of claim 20, wherein the reflective material includes a reflective material selected from the group of molybdenum-silicon films and molybdenum-beryllium films.

22. The reticle of claim 15, wherein the elements are spaced apart, having an element-free area between adjacent of the elements.

23. The reticle of claim 15, wherein the insulating material includes silicon dioxide.

24. The reticle of claim 15, wherein each of the elements includes a piezoelectric material between a pair of electrodes.

25. The reticle of claim 24, wherein the piezoelectric material includes a material selected from the group of quartz, rochelle salt, tourmaline, ammonium dihydrogen phosphate, and ephylenediamine tartrate; and
   wherein the electrodes include a material selected from the group of aluminum, titanium, gold, and silver.

* * * * *